United States Patent [19]

Walker

[11] Patent Number: 4,887,021

[45] Date of Patent: Dec. 12, 1989

[54] PRECISION NOISE SPIKE ELIMINATION CIRCUIT FOR PULSE WIDTH MODULATORS AND PWM INVERTERS

[75] Inventor: Charles S. Walker, Seattle, Wash.

[73] Assignee: Honeywell Inc., Minneapolis, Minn.

[21] Appl. No.: 304,074

[22] Filed: Jan. 31, 1989

[51] Int. Cl.$^4$ ............................................. G05F 1/565
[52] U.S. Cl. ..................................... 323/279; 323/273; 323/286; 361/111
[58] Field of Search ............... 323/282, 283, 284, 285, 323/286, 287, 290, 273, 276, 277, 279; 361/111

[56] References Cited

U.S. PATENT DOCUMENTS

| | | | |
|---|---|---|---|
| 3,265,956 | 8/1966 | Schlabach | 323/284 |
| 3,305,767 | 2/1967 | Beihl et al. | 323/282 |
| 3,675,158 | 7/1972 | Judd et al. | 323/286 |
| 4,521,726 | 6/1985 | Budnik | 323/283 |
| 4,607,210 | 8/1986 | Ohms et al. | 323/290 |
| 4,634,903 | 1/1987 | Montorfano | 323/290 |

*Primary Examiner*—Patrick R. Salce
*Assistant Examiner*—Jeffrey Sterrett
*Attorney, Agent, or Firm*—Whitham & Marhoefer

[57] ABSTRACT

Circuitry is provided to eliminate high frequency noise spikes in the output of a pulse width modulator and inverters employing pulse width modulators. This circuitry provides a precision noise spike elimination circuit based on a discovery that the switching of a MOSFET has two distinct regions: one in which only the drain current changes, and the other in which only the drain to source voltage changes. The precision noise spike elimination circuit includes a pair of back-to-back Zener diodes connected in parallel with the first current generator and direct feedback of the rate of change of voltage across the catch diode, thereby eliminating the effect of non-linear capacitance of the MOSFET in the feedback path. The back-to-back Zener diodes provide very precise control of the rate of change of the MOSFET current and catch-diode voltage. The more linear switching of the MOSFET due to the improved feedback results in a reduction in losses in the MOSFET for the same degree of noise reduction.

14 Claims, 14 Drawing Sheets

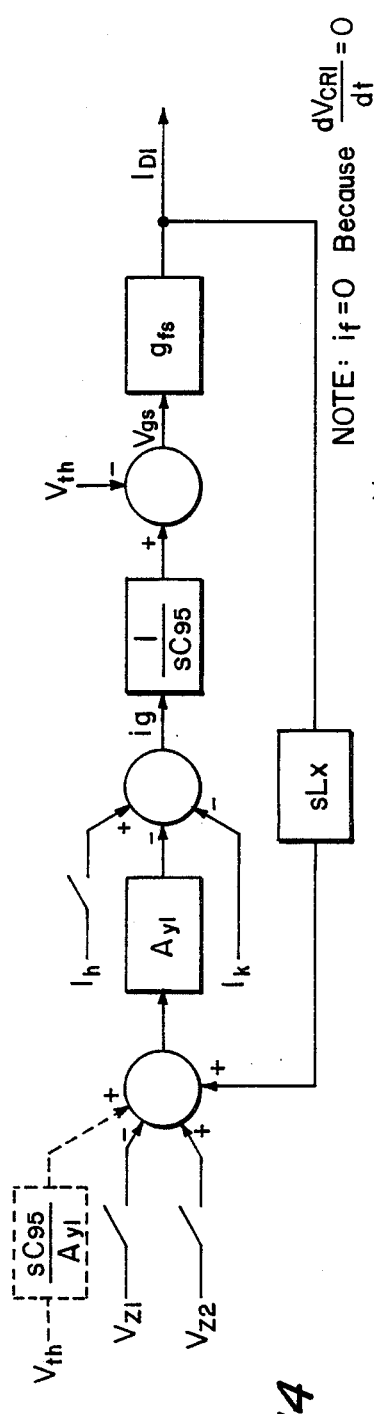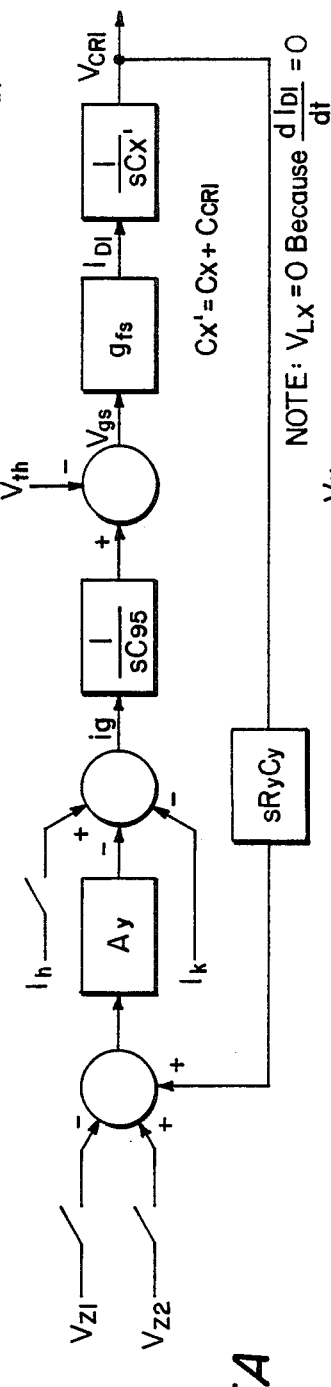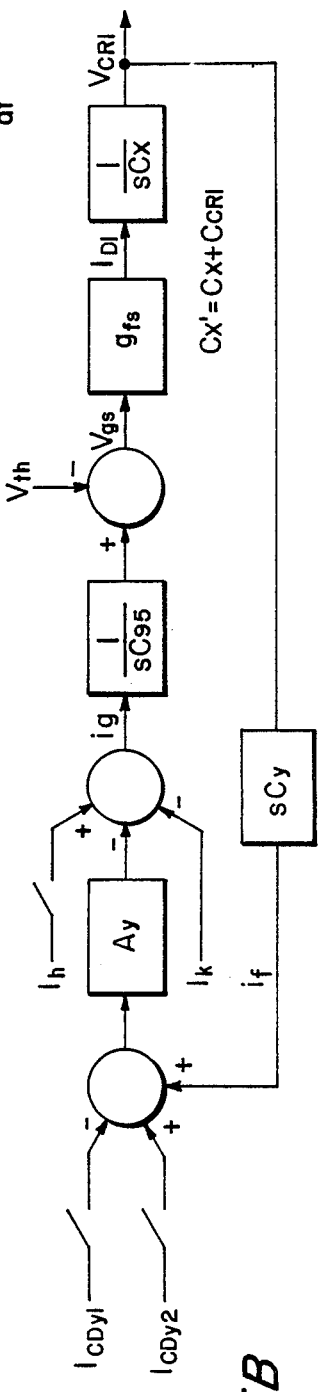
FIG. 14
FIG. 15A
FIG. 15B 4,887,021

PRECISION NOISE SPIKE ELIMINATION CIRCUIT FOR PULSE WIDTH MODULATORS AND PWM INVERTERS

CROSS-REFERENCE TO RELATED APPLICATIONS

The subject matter of this application relates to inventions disclosed in copending applications Ser. No. 07/299,508 filed Jan. 23, 1989, for "MOSFET Turn-On/Off Circuit" and Ser. No. 07/299,590 filed Jan. 23, 1989, for "Noise Spike Elimination Circuit for Pulse Width Modulators", both filed by Charles S. Walker and assigned to the assignee of this application. The disclosures of those applications are incorporated herein by reference.

DESCRIPTION

BACKGROUND OF THE INVENTION

1. Field of the Invention

This invention generally relates to voltage and current regulator circuits and, more particularly, to a circuit which eliminates noise spikes in pulse width modulators used in such regulator circuits.

2. Description of the Prior Art

Pulse width modulator (PWM) voltage regulators provide closely regulated voltage or current outputs with high electrical efficiency. They also generate high level, high frequency electrical noise, with frequency components typically in the 20 MHz range. Radiation at this frequency does not require wires for effective transmission. This radiation is undesirable for many reasons including interference with communications signals and easy detection by hostile forces. Because of the high levels and frequencies of the noise, effective spike suppression is difficult at best, if not impossible.

SUMMARY OF THE INVENTION

It is therefore an object of the present invention to provide a precision noise spike elimination circuit for pulse width modulators.

According to the invention, there is provided circuitry to eliminate high frequency noise spikes in the output of a pulse width modulator. This circuitry is an improvement on my invention disclosed in copending application Ser. No. 07/299,590 and provides a precision noise spike elimination circuit based on my discovery that the switching of the power MOSFET in this application has two distinct regions: one in which only the drain current changes, and the other in which only the drain to source voltage changes. My precision noise spike elimination circuit includes a pair of back-to-back connected Zener diodes. Used as references, the back-to-back Zener diodes provide very precise control of the rate of change of the MOSFET current and the rate of change of the catch diode voltage. Further, for equal noise spike reduction, the more linear switching of the MOSFET due to the improved feedback results in a reduction in losses in the MOSFET.

BRIEF DESCRIPTION OF THE DRAWINGS

The foregoing and other objects, aspects and advantages of the invention will be better understood from the following detailed description of a preferred embodiment of the invention with reference to the drawings, in which:

FIG. 3 is an oscillograph showing the voltage and current as the MOSFET switch in the voltage regulator turns on;

FIG. 14 is a block diagram showing the closed loop configuration for the current region of switching in the circuits of FIGS. 12A and 12B;

FIG. 15A is a block diagram showing the closed loop configuration for the voltage region of switching in the circuits of FIGS. 12A and 12B;

FIG. 15B is an alternate block diagram showing the addition of current regulator diodes used as references in the voltage region;

DETAILED DESCRIPTION OF A PREFERRED EMBODIMENT OF THE INVENTION

Figure 1:
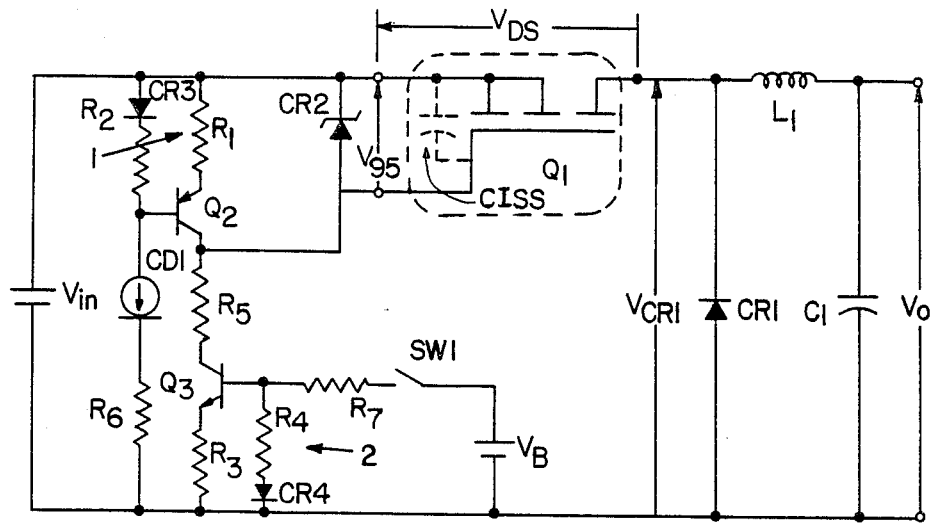
FIG. 1 is a schematic circuit diagram showing a buck-type voltage regulator which may be used in the practice of the invention.

Referring now to the drawings, and more particularly to FIG. 1, there is shown a pulse width modulator in which a dual current source is used to control a P- channel MOSFET switch $Q_1$. This circuit is the subject of my copending patent application Ser. No. 07/299,508. The circuit includes a turn-off current generator 10 and a turn-on current generator 12. The turn-off current generator 10 comprises a resistor $R_2$ which, with diode $CR_3$, sets the base potential of PNP transistor $Q_2$. Diode $CR_3$ provides approximately 0.6 V and a negative temperature coefficient ($\cong -2$ mV/°C.) to offset similar quantities in transistor $Q_2$. A current regulator diode $CD_1$ provides a constant current for resistor $R_2$ and diode $CR_3$. An optional resistor, $R_6$, may be connected in series with diode $CD_1$ to share the power loss with that diode. A dropping resistor, $R_1$, in the emitter circuit of transistor $Q_1$ sets the turn-off current level $i_{toff} = V_{R2}/R_1$. A Zener diode $CR_2$ limits the gate-to-source voltage of transistor $Q_1$ to approximately 8 V.

The turn-on current generator 12 comprises an NPN transistor $Q_3$ having its collector connected to the collector of transistor $Q_2$ via an optional resistor $R_5$ which may be added to share the power loss with transistor $Q_3$. Resistor $R_4$, with bias voltage $V_B$ and resistor $R_7$, set the base potential of transistor $Q_3$. Resistor $R_7$ could be a current reference diode if $V_B$ is not a fixed voltage. Diode $CR_4$ provides a similar voltage drop and temperature coefficient function for transistor $Q_3$ as that provided by diode $CR_3$ for transistor $Q_2$. The emitter resistor, $R_3$, determines the turn-on current for transistor $Q_3$ in the same way as resistor $R_1$ does for transistor $Q_2$.

The high gain PNP transistor $Q_2$ and high gain NPN transistor $Q_3$ provide almost ideal current sources. Closing switch $SW_1$ turns on current source 12 which overpowers current source 10. The net current charges MOSFET $Q_1$ gate-to-source capacitance, $C_{iss}$, which, upon reaching the 2 to 4 volt threshold, begins to turn on $Q_1$. When switch $SW_1$ is opened, current source 10 discharges $C_{iss}$ turning off $Q_1$.

Figure 2:
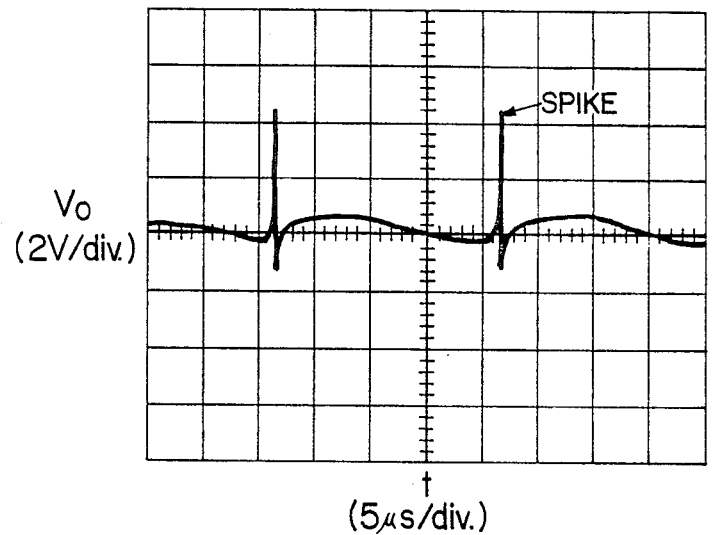
FIG. 2 is an oscillograph showing voltage spikes appearing across the output capacitor of the voltage regulator shown in FIG. 1.

A typical output voltage spike for this circuit is shown in FIG. 2. This is an oscillograph showing 2 to 4 volt spikes appearing across output capacitor $C_1$. High frequency "ringdown" is apparent. These voltage spikes are caused by three factors. They are (1) the fast $Q_1$ MOSFET switching time illustrated in FIG. 3, (2) the very fast catch diode $CR_3$ recovery time illustrated in FIG. 5, and (3) the non-ideal $L_1$, $C_1$ filter characteristics at high frequency illustrated in FIG. 7.

Figure 3:
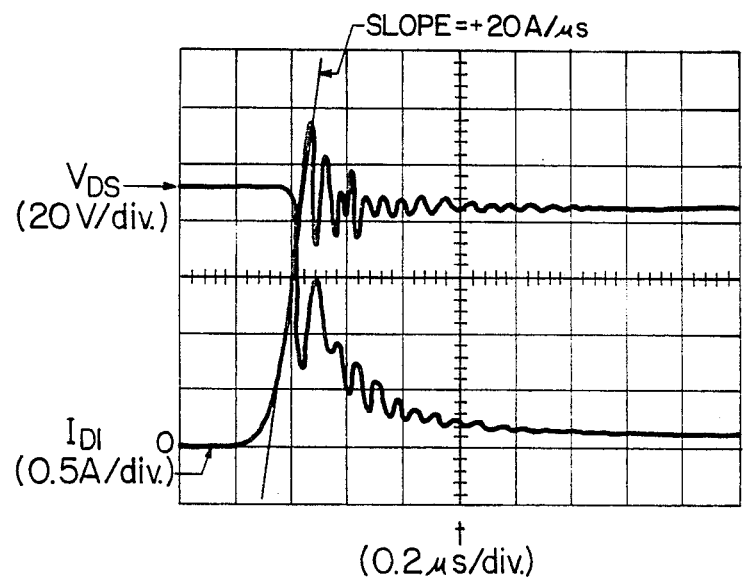

The oscillograph shown in FIG. 3 shows MOSFET $Q_1$ turning on. The drain current, $I_{D1}$, reaches a di/dt rate of 20A/µsec. The catch diode, $CR_1$, provides a path for inductor $L_1$ current when $Q_1$ is off. $Q_1$ first reduces the catch diode current to zero then furnishes the load current through $L_1$.

Figure 4:
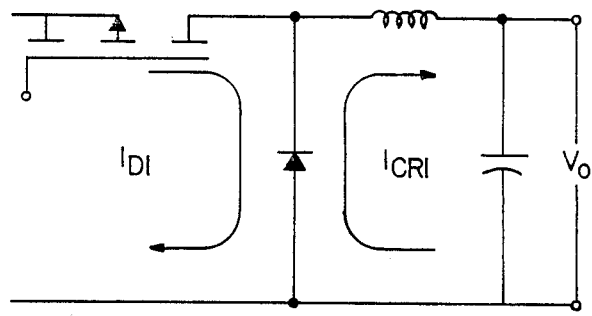
FIG. 4 is a schematic circuit diagram illustrating the currents in the catch diode connected in the output circuit of the MOSFET switch.
Figure 5:
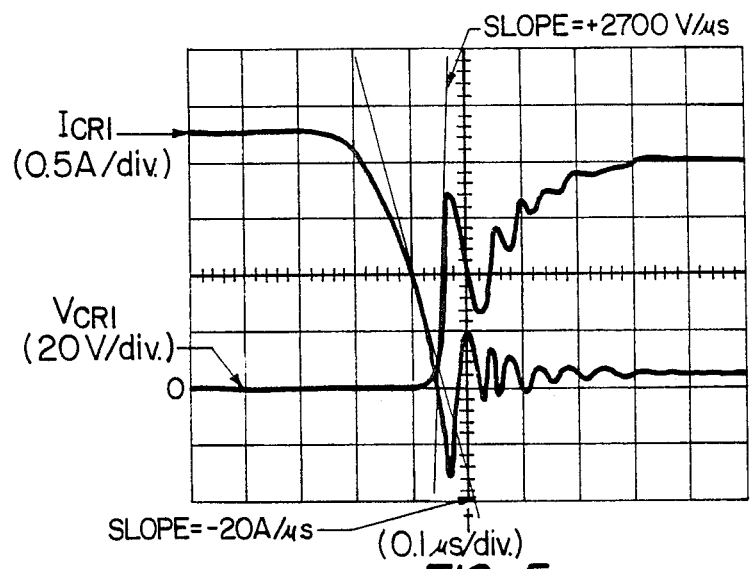
FIG. 5 is an oscillograph showing the voltage and current of the catch diode in the voltage regulator at switching.

FIG. 4 illustrates the loop currents $I_{D1}$ and $I_{CR1}$ through the catch diode $CR_1$. The oscillograph shown in FIG. 5 shows the catch diode current and voltage at switching. Apparent is the very fast diode voltage rise-time. It is this voltage that causes the output voltage spike. For very fast $CR_1$ voltage rise times, the filtering components $L_1$ and $C_1$ are only partially effective.

Figure 6:
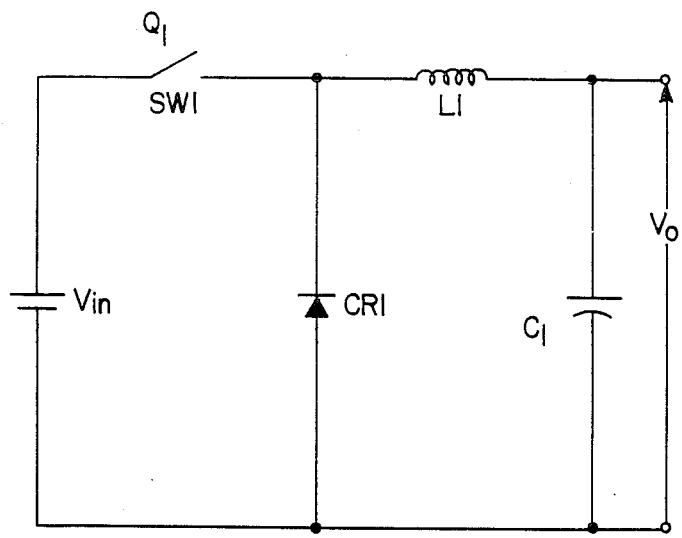
FIG. 6 is a schematic diagram showing the low frequency equivalent circuit of the catch diode and output filter circuit.
Figure 7:
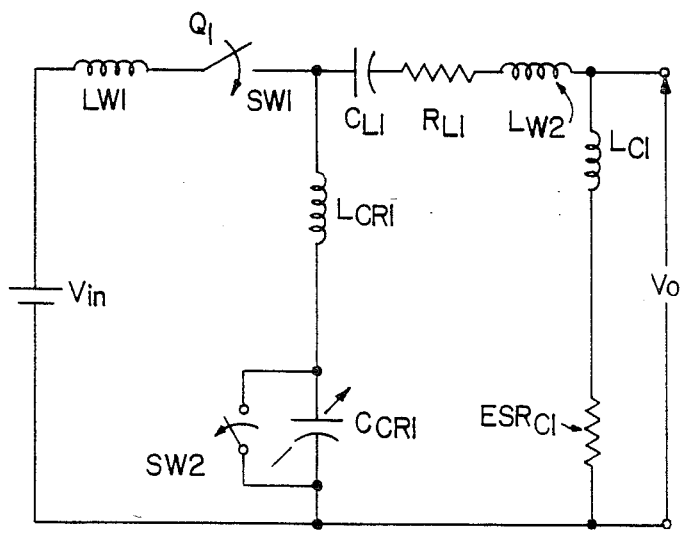
FIG. 7 is a schematic diagram showing the high frequency equivalent circuit of the catch diode and output filter circuit.

FIGS. 6 and 7 show the equivalent circuits for $L_1$, $C_1$ and the catch diode $CR_1$ at low and high frequencies, respectively. For the rise time produced by the $CR_1$ catch diode, the components, shown ideally in FIG. 6, actually become those shown in FIG. 7. Inductor $L_1$ becomes a capacitor due to interwinding capacitance, diode $CR_1$ becomes a variable capacitor, due to its junction diode characteristics, connected in series with its lead inductance, and $C_1$ becomes an inductor due to its lead inductance in series with a resistor, corresponding to the ESR of the capacitor. Finally, the connection leads provide series inductors $L_{W1}$ and $L_{W2}$. Switch $SW_2$ represents the "recovery" of $CR_1$. When this switch opens, the $Q_1$ current pours into $C_{CR1}$, rapidly increasing its voltage.

The foregoing analysis suggests several ways to eliminate the voltage spikes. First, slow down the switching time of $Q_1$. Second, make the voltage rise time of $CR_1$ longer; i.e., smaller dV/dt. Third, improve the high frequency characteristics of the output filter. These are implemented in the circuit shown in FIG. 8, which is the subject of my copending patent application Ser. No. 07/299,950.

Figure 8:
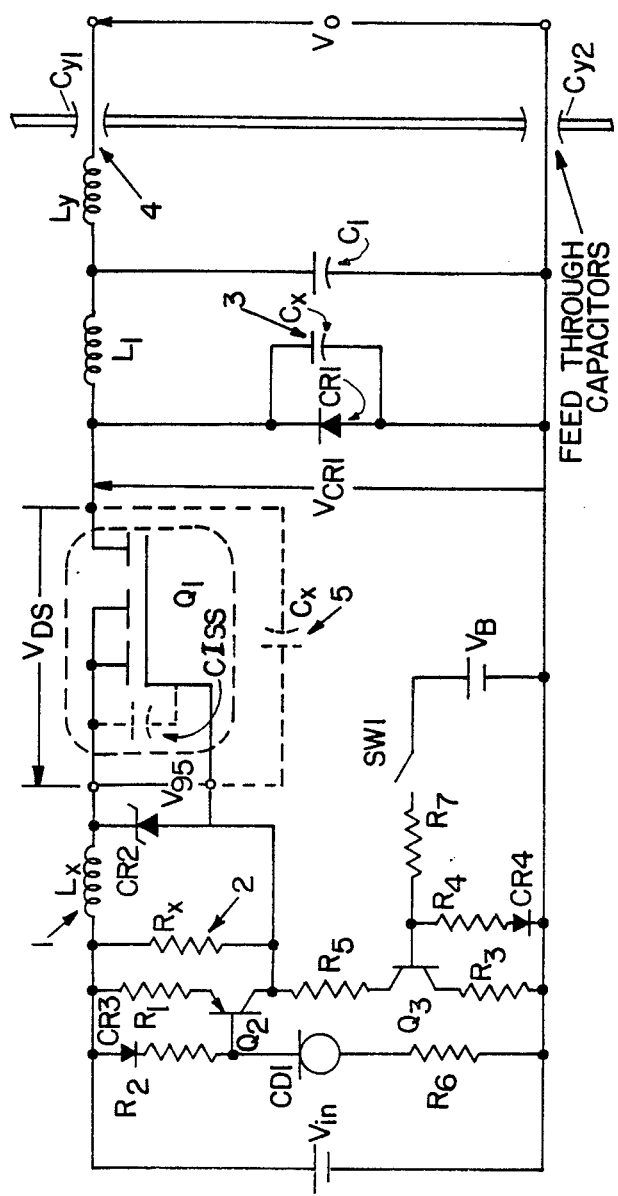
FIG. 8 is a schematic diagram of the voltage regulator circuit shown in FIG. 1 modified to provide noise spike elimination.

In FIG. 8, inductor $L_x$ is connected between the source of MOSFET $Q_1$ and the input voltage source $V_{in}$ and provides negative feedback to control di/dt. Resistor $R_x$ is connected between the collector of PNP transistor $Q_2$ and the input voltage source $V_{in}$ and establishes a voltage potential for $V_{Lx}$ to work against. Capacitor $C_x$ is connected across catch diode $CR_1$ and swamps the non-linear capacitance of the diode and slows the rise time by increasing the capacitance from 45 pF to 1045 pF. High frequency inductor/feedthrough capacitors $C_{y1}$ and $C_{y2}$ give additional filtering. Finally, capacitor $C_z$ may be optionally added if variations of the MOSFET $C_{iss}$ proves excessive. The addition of these six components reduces voltage spikes on the output of the PWM to negligible levels.

Figure 9:
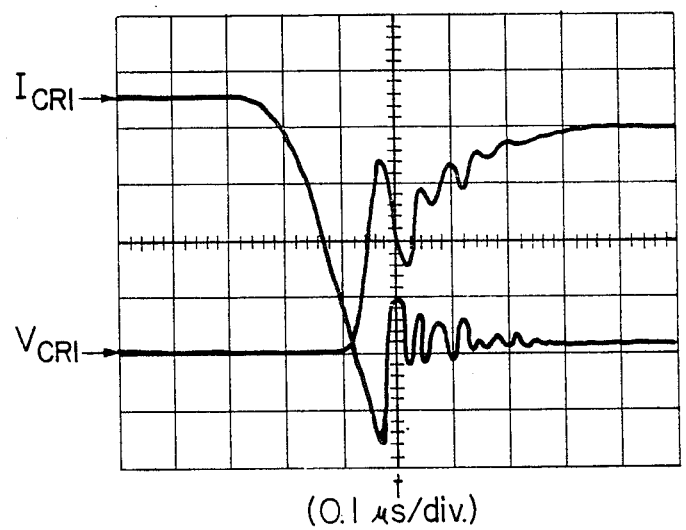
FIG. 9 is an oscillograph showing the catch diode voltage and current at switching before implementing the circuit of FIG. 8.
Figure 10:
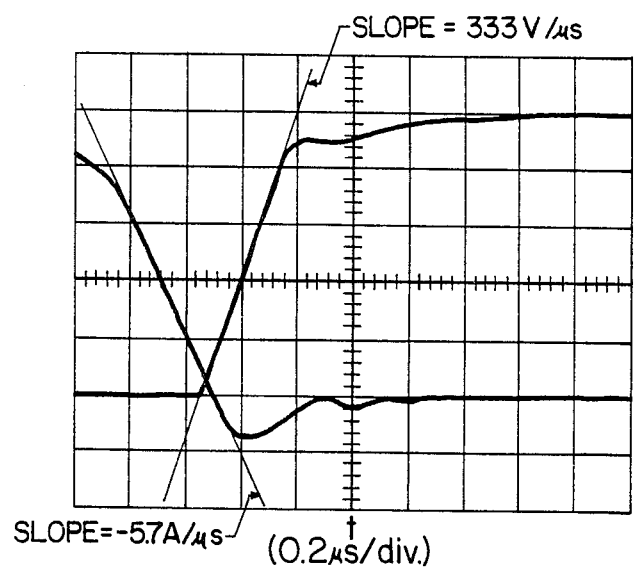
FIG. 10 is an oscillograph showing the catch diode voltage and current at switching after implementing the circuit of FIG. 8.
Figure 11:
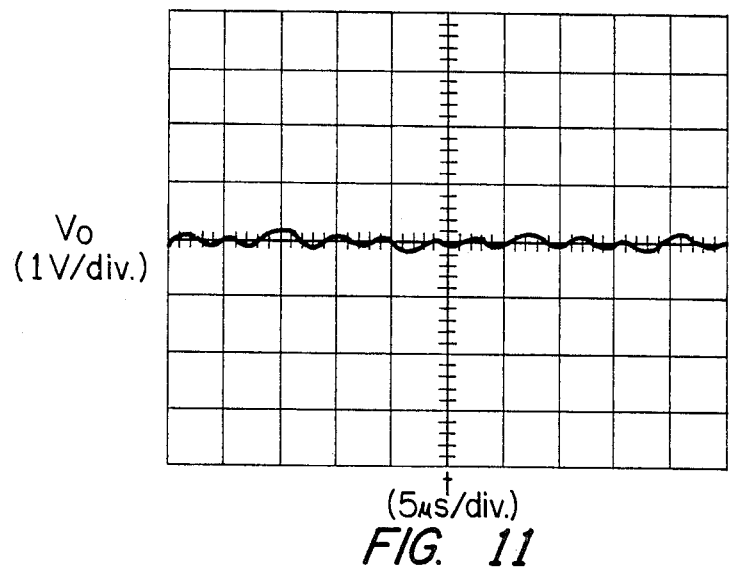
FIG. 11 is an oscillograph showing the output ripple voltage after implementing the circuit of FIG. 8.

FIGS. 9 and 10 are before and after oscillographs of voltage $V_{CR1}$ and current $I_{CR1}$. Inductor $L_x$ and capacitor $C_x$ provide the desired results. $dI_{CR1}/dt$ has been reduced from $-20$ to $-5.7$A/µsec and $dV_{CR3}/dt$ from approximately 2,700 to 333 V/µsec. As shown in FIG. 10, the 10 MHz ringing has been eliminated. Inductor $L_y$ and feedthrough capacitors $C_{y1}$ and $C_{y2}$ are high frequency components. Inductor $L_y$ has a cut-off frequency of 125 MHz, well above the 10 to 20 MHz observed values in the circuit. Feed-through capacitors $C_{y1}$ and $C_{y2}$ continue to provide attenuation beyond 1000 MHz. FIG. 11 shows the output ripple after the addition of inductor $L_x$, capacitor $C_x$, resistor $R_x$, inductor $L_y$, and capacitors $C_{y1}$ and $C_{y2}$.

Upon further analysis, it was discovered that this circuit could be improved, and that improvement is the subject of the present invention. More specifically I have discovered a key circuit property which was masked by the highly non-linear MOSFET parameters. This property is that the MOSFET $Q_1$ switching has two distinct regions: one in which only the drain current $I_{D1}$ (and $I_{CR1}$) changes and one where only the drain-source voltage $V_{DS}$ (and $V_{CR1}$) changes. This means that there can be two separate feedback loops, one controlling current rise time and one controlling voltage rise times.

Figure 12B:
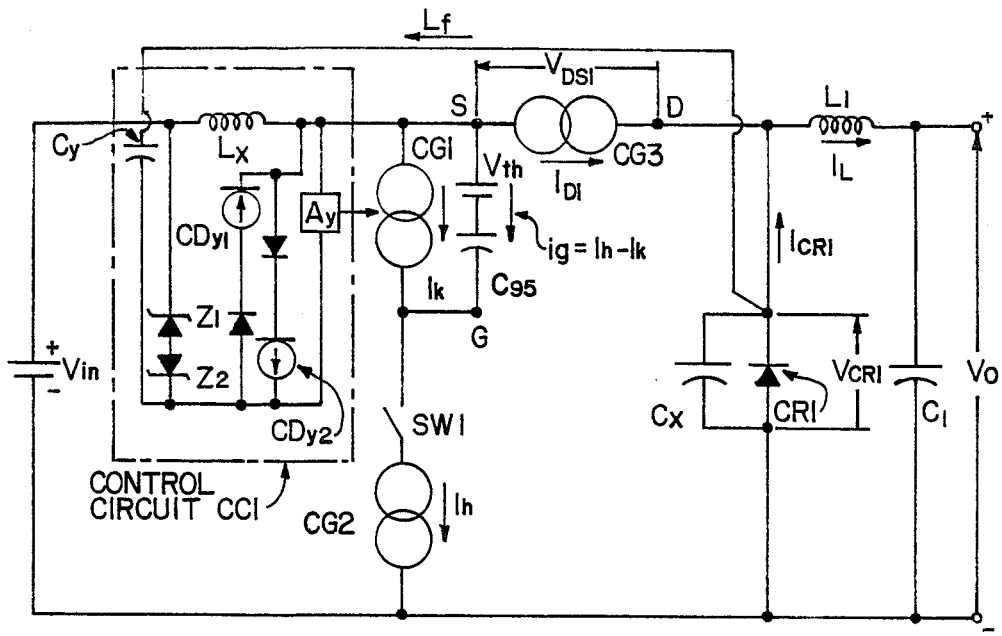
FIG. 12A and 12B are equivalent circuits of the precision noise spike elimination circuit useful for purposes of analysis.
Figure 12A:
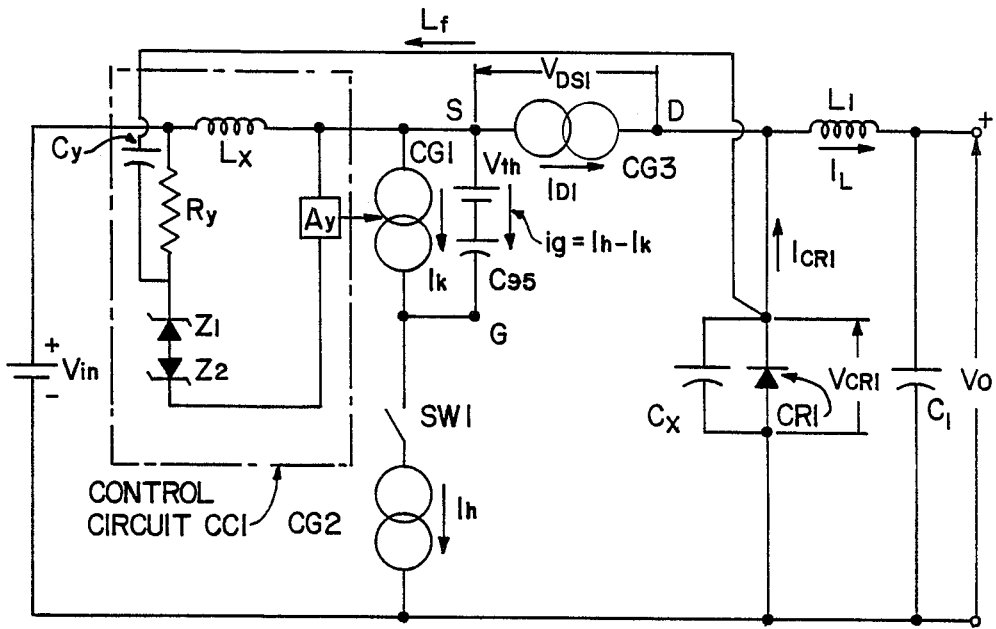

These principles led to the development of an improved circuit where very precise control of the noise spike producing rise and fall times can be achieved. FIGS. 12A and 12B show equivalent circuits used to illustrate these ideas. The equivalent circuits contain two current generators $CG_1$ and $CG_2$ corresponding to current generators 10 and 12 in FIG. 1. Closing switch $SW_1$ turns on MOSFET $Q_1$ by increasing the gate-to-source voltage above the threshold value, $V_{th}$. The gate current, $i_g$, increases the charge on the gate-to-source capacitor $C_{gs}$ (approximately $C_{iss}$ for $V_{DS} > 25$ V) thereby increasing the drain current, $I_{D1}$, represented by current generator $CG_3$. Back-to-back Zener diodes $Z_1$ and $Z_2$ replace resistor $R_x$ and control the drain current, $I_{D1}$, (and catch diode current, $I_{CR1}$) rise and fall times. Current generators CG$_1$ and CG$_2$ also control the catch diode voltage, $V_{CR1}$, rise and fall times. Here, CR$_1$ is represented by an ideal diode in parallel with a capacitor $C_x$.

Figure 13:
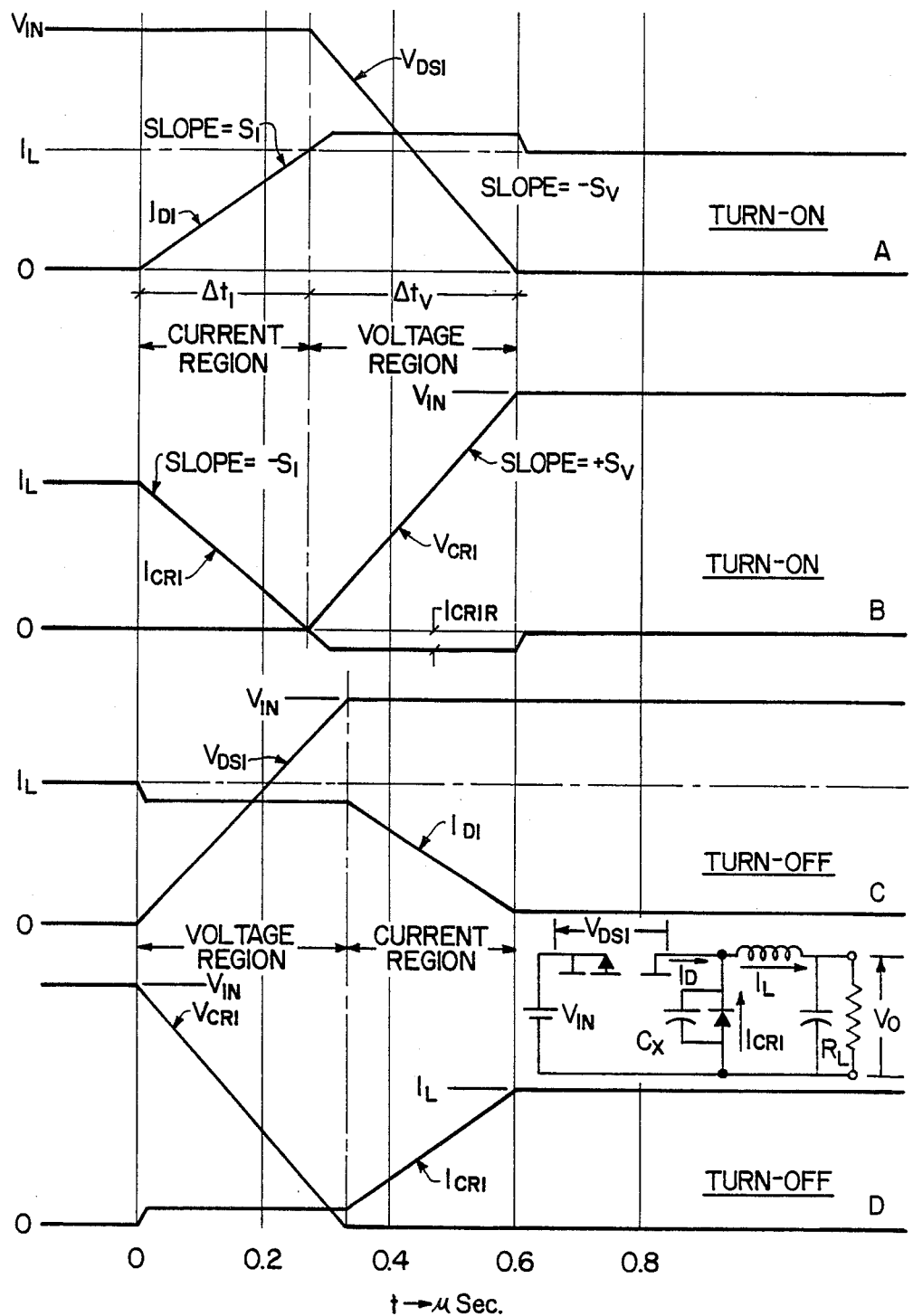
FIG. 13 is timing diagram showing the ideal rise and fall times of voltage and currents in the equivalent circuits shown in FIGS. 12A and 12B.

The circuits shown in FIGS. 12A and 12B can ideally control the rise and fall times. These are shown in FIG. 13. Switching starts at t=0. The drain current, $I_{D1}$, increases at a predetermined rate, $S_I$ Amp/μsec. The voltage across catch diode CR$_1$ remains at zero because it is still conducting current. When the drain current, $I_{D1}$, equals the inductor current, $I_L$, diode CR$_1$ starts to "recover" and its voltage increases due to current $I_{CR1}$ becoming negative. This occurs at a rate $S_V = dV_{CR1}/dt$ volts/μsec. accompanied by an equal, but opposite in sign, rate of change in voltage $V_{DS1}$. It should be noted that during the drain current $I_{D1}$ rise and fall times $V_{DS1}$ will vary from these idealized waveforms due to voltage drops across inductor $L_x$.

Precise control of the $dI_{D1}/dt$ and $dV_{CR1}/dt$ slopes, both positive and negative, is achieved by control circuit CC$_1$ consisting of Zener diodes Z$_1$ and Z$_2$, inductor $L_x$, capacitor $C_y$, resistor $R_y$ and amplifier $A_y$, all shown in FIG. 12A. After switch SW$_1$ closes, capacitor $C_{gs}$ charges and MOSFET Q$_1$, represented by current generator CG$_3$, begins to turn on when the threshold voltage $V_{th}$ is reached. This results in a voltage across inductor $L_x$ equal to $L_x \, dI_{D1}/dt$. When this latter value equals the breakdown (regulating) voltage of Zener diode Z$_1$, amplifier $A_y$ acts in such a way as to increase the current $I_k$ supplied by current generator CG$_1$. Since the MOSFET gate current equals $I_h$ less $I_k$, the gate current, $i_g$, is reduced and controlled resulting in a constant rate of change in the drain current $I_{D1}$.

In an entirely similar manner, when diode CR$_1$ "recovers" and begins to climb in voltage, capacitor $C_y$ differentiates this voltage ($dV_{CR1}/dt$) and produces feedback current $i_f$, where $i_f = C_y dV_{CR1}/dt$. Current $i_f$ develops a voltage drop across resistor $R_y$. When this voltage equals the regulating voltage of Zener diode Z$_1$, amplifier $A_y$ acts in such a way as to increase current $I_k$ providing the same regulation action as above, except $dV_{CR1}/dt$ is being controlled rather than $dI_{D1}/dt$. In the turn-off mode, switch SW$_1$ is open. Again, control circuit CC$_1$ acts to regulate both $dV_{CR1}/dt$ and $dI_{D1}/dt$ by modulating (i.e., reducing) current $I_k$.

In FIG. 12B, resistor $R_y$ is removed and parallel current reference diodes CD$_{y1}$ and CD$_{y2}$ are added. When the feedback current, $i_f$, equals the regulating current of diode CD$_{y1}$, any excess current goes to amplifier $A_y$. The $dV_{CR1}/dt$ regulating action occurs in this alternate circuit as in the circuit shown in FIG. 12A using resistor $R_y$. The circuit shown in FIG. 12B exemplifies the current-voltage "duality" concept where voltage and current, and inductance and capacitance are interchanged as follows:

| Mode Regulating | $dI_{D1}/dt$ current slope | $dV_{CR1}/dt$ voltage slope |
|---|---|---|
| Sensor | $L_y$ | $C_y$ |
| Reference | $Z_1, Z_2$ | $CD_{y1}, CD_{y2}$ |

Presently available current regulator diodes are not as "ideal" as the voltage reference diodes are. Thus, the preferred implementation is shown in FIG. 12A.

Two block diagrams can be constructed from the differential equations describing the electrical relationships in FIGS. 12A and 12B. FIG. 14 describes the dynamic behavior of the circuit in the current region. "s" is the LaPlace transform operator. The output in LaPlace transform notation is given by the following. For turn on, $$I_{D1}(s) = \frac{G}{1 + GH} \times \frac{V_{Z1}}{s}$$

$$G = \frac{g_{fs}A_y}{sC_{gs}} \quad H = sL_x$$

$$I_{D1}(s) = \frac{g_{fs}A_y}{sC_{gs}} \times \frac{1}{1 + \frac{g_{fs}A_yL_x}{C_{gs}}} \times \frac{V_{Z1}}{s}$$

If $\frac{g_{fs}A_yL_x}{C_{gs}} \gg 1$, then $$I_{D1}(s) = \frac{1}{SL_x} \times \frac{V_{z1}}{s} = \frac{V_{z1}}{s^2 L_x}$$

Taking the inverse Laplace transform, $$I_{D1}(t) = \frac{V_{Z1}}{L_x} t$$

and $dI_{D1}(t)/dt = V_{Z1}/L_x$ Thus, the current slope can be very tightly controlled because inductance $L_x$ and Zener diode Z$_1$ can be precision components.

The forward current transfer ratio, $g_{fs1}$, and the gate-to-source capacitance, $C_{gs}$, are MOSFET parameters, while amplifier $A_y$, Zener breakdown voltage $V_{Z1}$ and inductance $L_x$ are part of the circuit design and can be selected. For example, if $dI_{D1}/dt = 5$ A/μsec. is desired, the Zener breakdown voltage could be selected as 7.5 V and inductance $L_x$ as 1.5 μH:

$$dI_{D1}(t)/dt = \frac{V_{Z1}}{L_x} = \frac{7.5}{1.5 \times 10^{-6}} = 5 \, A/\mu sec.$$

The International Rectifier Hexfet® data book (4th edition) gives for the 2N6806 P-channel MOSFET these typical values:

$$C_{iss} = C_{gs} = 550 \text{ pF} \quad \text{for } V_{DS} = -25V$$
$$g_{fs} = 3.5 \text{ mhos} \quad \text{for } I_D = -4A$$

For $\frac{g_{fs}A_yL_x}{C_{gs}} \gg 1$, $$A_y \gg \frac{C_{gs}}{g_{fs}L_x} = \frac{550 \times 10^{-12}}{4 \times 1.5 \times 10^{-6}}$$

$$A \gg 92 \times 10^{-6} = 92 \, \mu A/\text{volt}$$

The MOSFET gate-to-source threshold can be controlled by circuit design. Referring to FIG. 14 again, the threshold voltage $V_{th}$ can be moved to the input by dividing by the intervening blocks as indicating (by the dashed block). Solving just for the effect of $V_{th}$:

$$I_{D1}(s) = \frac{1}{sL_x} \times \frac{sC_{gs}}{A_y} \times \frac{V_{th}}{s}$$

$$= \frac{C_{gs}}{A_y L_x} \times \frac{V_{th}}{s}$$

$$I_{D1}(t) = \frac{C_{gs}}{A_y L_x} \times V_{th}$$

Thus, because of the forward-loop integrator, providing by the gate-to-source capcitance, the drain current slope error due to $V_{th}$ is zero.

FIG. 15A shows the block diagram for the voltage region. In a similar manner to the voltage loop, $$V_{CR1}(s) = \frac{G}{1 + GH} \times \frac{V_{Z1}}{s}$$

$$G = \frac{g_{fs} A_y}{s^2 C_{gs} C_x} \quad H = sR_y C_y$$

$$V_{CR1}(s) = \frac{g_{fs} A_y}{s^2 C_{gs} C_x} \times \frac{1}{1 + \frac{g_{fs} A_y R_y C_y}{sC_{gs} C_x}} \times \frac{V_{Z1}}{s}$$

$$= \frac{\alpha}{sR_y C_y} \times \frac{1}{(s + \alpha)} \times \frac{V_{Z1}}{s}$$

$$= \frac{\alpha}{R_y C_y s^2 (s + \alpha)} \times V_{Z1}$$

where $\alpha = \frac{g_{fs} A_y R_y C_y}{C_{gs} C_x}$

Taking the inverse transform, $$V_{CR1}(t) = \frac{\alpha}{R_y C_y} \times \frac{1}{\alpha^2} \times [e^{-\alpha t} + \alpha t - 1] \times V_{Z1}$$

If $\alpha t = \frac{g_{fs} A_y R_y L_y t}{C_{gs} C_x} >> 1$, $V_{CR1}(t)$ is approximated by $$V_{CR1}(t) = \frac{V_{xl}}{R_y C_y} t$$

and $dV_{CR1}(t)/dt = V_{Z1}/R_y C_y$, which is again dependent only on precision components. It is noted that the results are almost exactly the same as for the voltage loop. If, for example, $dV_{CR1}/dt = 300$ V/ sec. was desired, and $V_{Z1} = 7.5$ V, then $$R_y C_y = \frac{7.5}{300 \times 10^6} = 25,000 \ \Omega pF$$

If $C_y = 100$ pF, then $R_y = 250 \ \Omega$ and $$I_{Cy} = C_y \frac{dV}{dt} = 10^{-10} \times 300 \times 10^6 = 30 \text{ mA}$$

As expected, $I_{Cy} \times R_y = 0.03 \times 250 = 7.5 V = V_{Z1}$.

For the rate-of-change of the voltage loop, $\alpha t$ is made large compared to unity, or $$\frac{g_{fs} A_y R_y C_y}{C_{gs} C_x} t >> 1$$

Let $t \cong 10^{-6}$ sec. and solve for $C_x$ as follows:

$$\frac{1}{C_x} >> \frac{C_{gs}}{g_{fs} A_y R_y C_y t}$$

$$= \frac{550 \times 10^{-12}}{3.5 \times 92 \times 10^{-6} \times 250 \times 100 \times 10^{-12} \times 10^{-6}}$$

$$= \frac{1}{14,636 \times 10^{-12}}$$

Thus, $C_x << 14,636$ pF. Selecting $C_x = 100$ pF satisfies this condition and swamps out, to a large degree, the capacitance of $CR_1$ which is typically on the order of 45 pF. FIG. 15B shows the block diagram when using current regulating diode currents $I_{CDy1}$ and $I_{CDy2}$ as references. Everything remains the same if $I_{CDy1} = I_{CDy2} = V_{Z1}/R_y = V_{Z2}/R_y$.

Figure 16A:
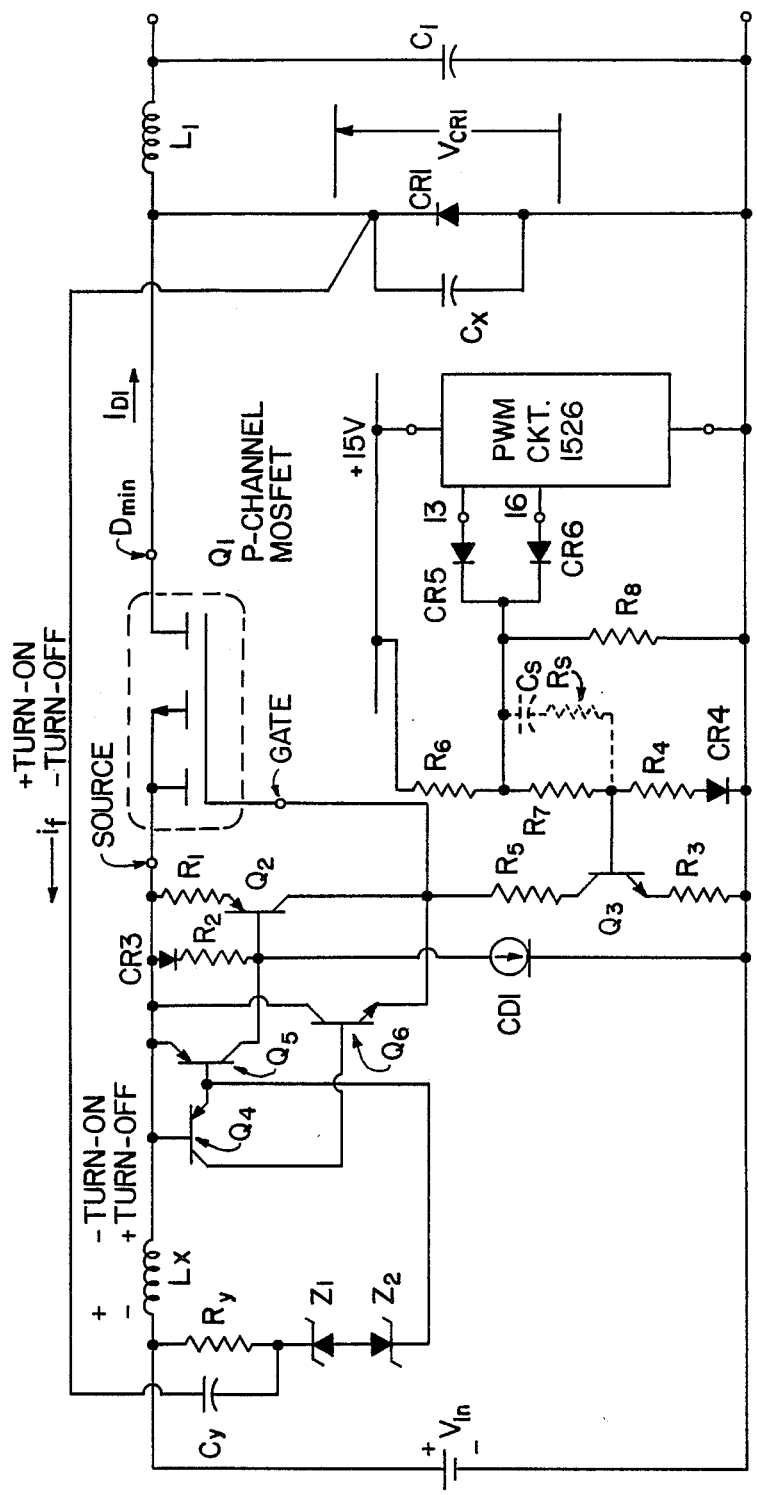
FIGS. 16A and 16B are schematic diagrams showing the precision noise spike elimination circuit for pulse width modulators.

An implementation of the circuit represented in FIGS. 12A and 14 is shown in FIG. 16A. Inductor $L_x$, resistor $R_y$, Zener diodes $Z_1$ and $Z_2$ and capacitor $C_y$ are as in FIG. 12A. Bipolar transistors $Q_4$, $Q_5$ and $Q_6$ form amplifier $A_y$. Resistors $R_1$ and $R_2$, transistor $Q_2$ and diode $CR_3$ form current generator $CG_2$. Finally, current generator $CG_3$ is implemented with the P-channel MOSFET $Q_1$. Pulse-width modulation is provided by integrated circuit (IC) type 1526.

In operation, the output of the 1526 IC is assumed to be initially low. Transistor $Q_2$ is on because of current regulator diode $CD_1$. The MOSFET $Q_1$ gate-to-source capacitance is discharged. When the pulse width modulator output goes high, transistor $Q_3$ turns on which in turn tries to turn on MOSFET $Q_1$. The rate of change of drain current increases, and when the voltage developed across inductor $L_x$ exceeds the breakdown voltage of Zener diode $Z_1$, transistor $Q_4$ is turned on which in turn turns on transistor $Q_6$, thus by-passing some of the MOSFET gate current turn-on current furnished by transistor $Q_3$. In this way, the rate of change of the MOSFET drain current, $dI_{D1}/dt$, is regulated. When drain current $I_{D1}$ reaches the load current level, catch diode $CR_1$ starts to recover and the voltage across capacitor $C_x$ starts to rise. The feedback current, $i_f$, creates a positive voltage drop across resistor $R_y$. This acts in the same way as the voltage drop across inductor $L_x$ and turns on transistor $Q_4$ resulting in the same limiting action as described above.

When the pulse width modulator's output goes low, transistor $Q_3$ turns off and the voltage across capacitor $C_x$ starts to decrease. The feedback current, $i_f$, is now negative producing a negative voltage across resistor $R_y$. This turns on transistor $Q_5$ which reduces the voltage across resistor $R_2$. This action in turn slows down the discharge of the MOSFET gate-to-source capacitance reducing the rate of change of the voltage across capacitor $C_x$. When voltage $V_{CR1}$ reaches zero, and goes slightly negative, drain current $I_{D1}$ begins to fall and the voltage across inductor $L_x$ becomes negative. This voltage now takes over continuing to hold transistor $Q_5$ on resulting in the same action as described immediately above.

Figure 16B:
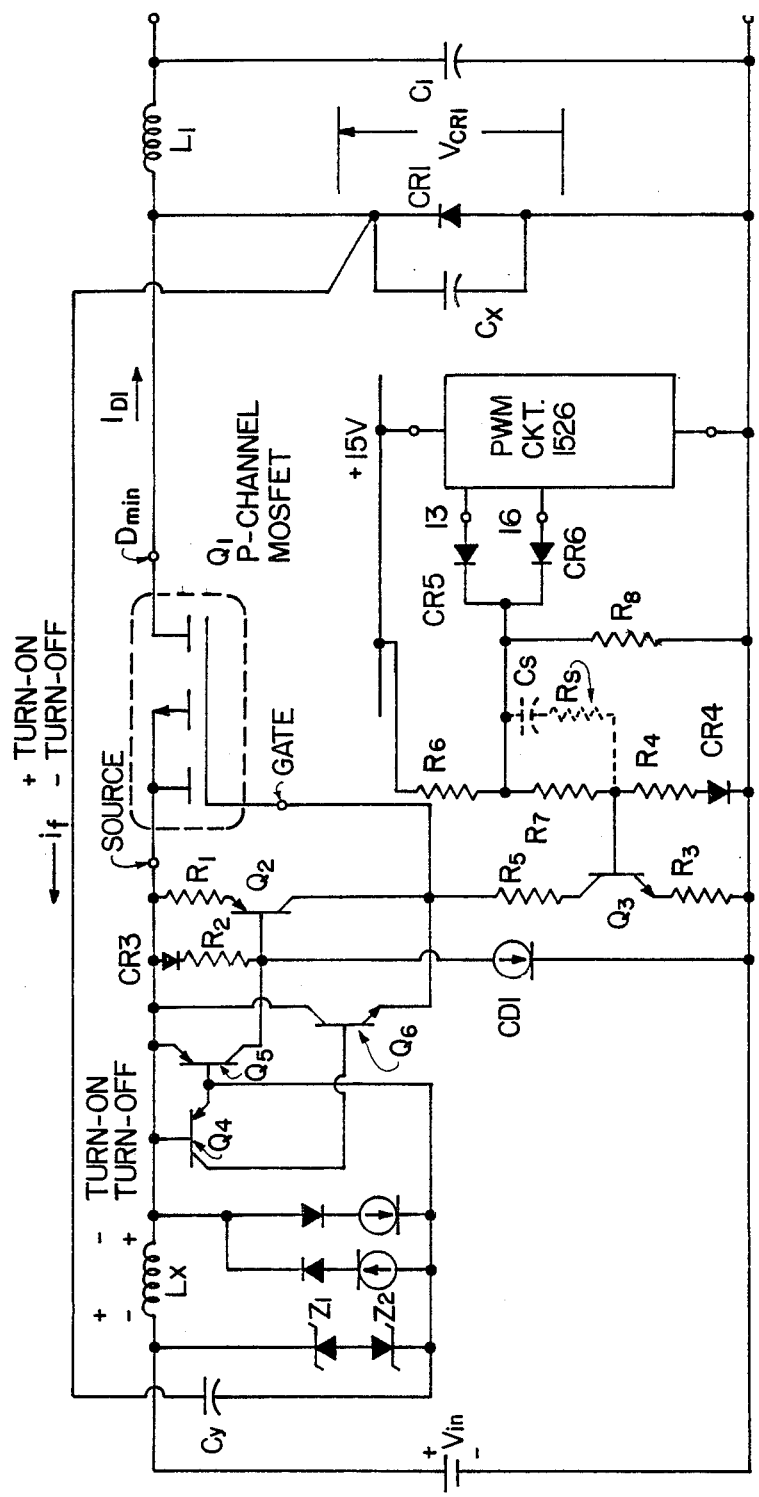

FIG. 16B shows the paralleled current regulator diode version. Here the operation is the same as for FIG. 16A in the current mode. In the voltage mode, the feedback current, $i_f$, flows through diodes $CD_{y1}$ and $CD_{y2}$ until the current regulating level is reached. At this point, the excess current flows into transistors $Q_4$ or $Q_5$ regulating the voltage slope.

Some advantages of these circuits are as follows:

(a) The transistors are not saturated and, hence, there are no storage time problems.

(b) Transistors $Q_4$ and $Q_5$ provide mutual self-protection through base to emitter and emitter to base connections.

(c) Turn-on current enhancement is provided by resistance $R_s$ and capacitance $C_s$. This feature provides the current needed for turn-on while at the same time reduces the steady state losses.

(d) Performance values depend on the precision component selection, not the semiconductor characteristics, which have wide tolerance ranges.

Figure 17:
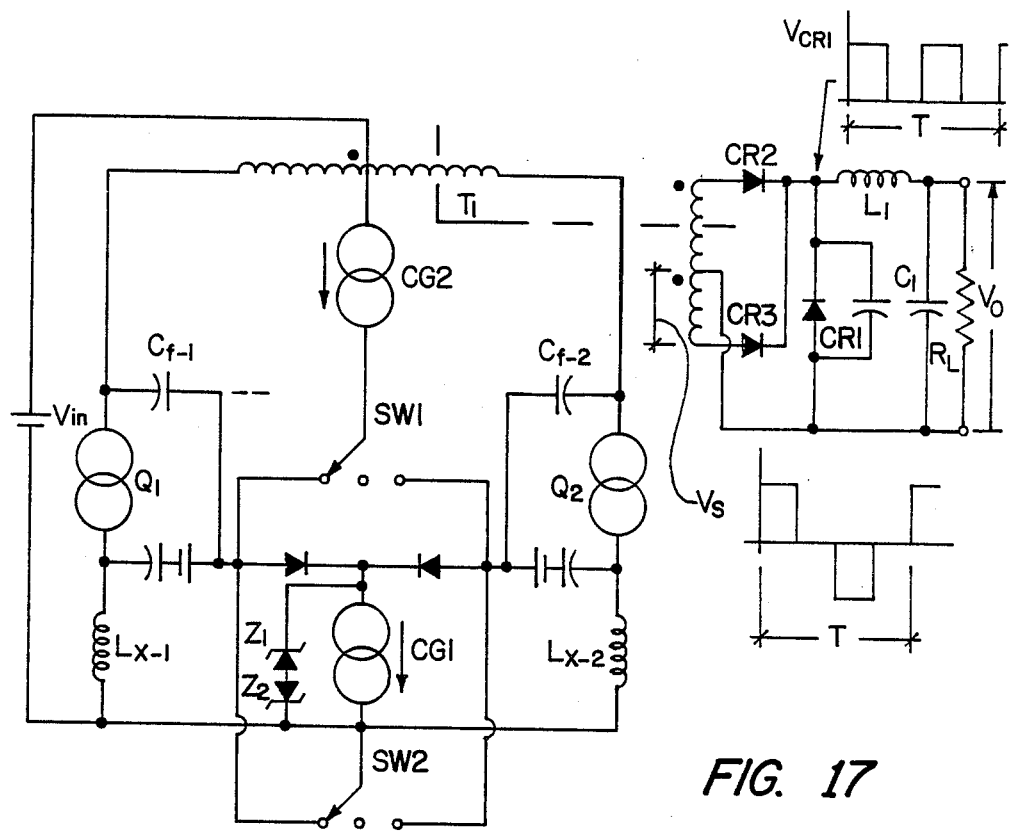
FIG. 17 is a simplified schematic diagram of a typical PWM inverter which can be implemented according to the teachings of this invention.
Figure 18:
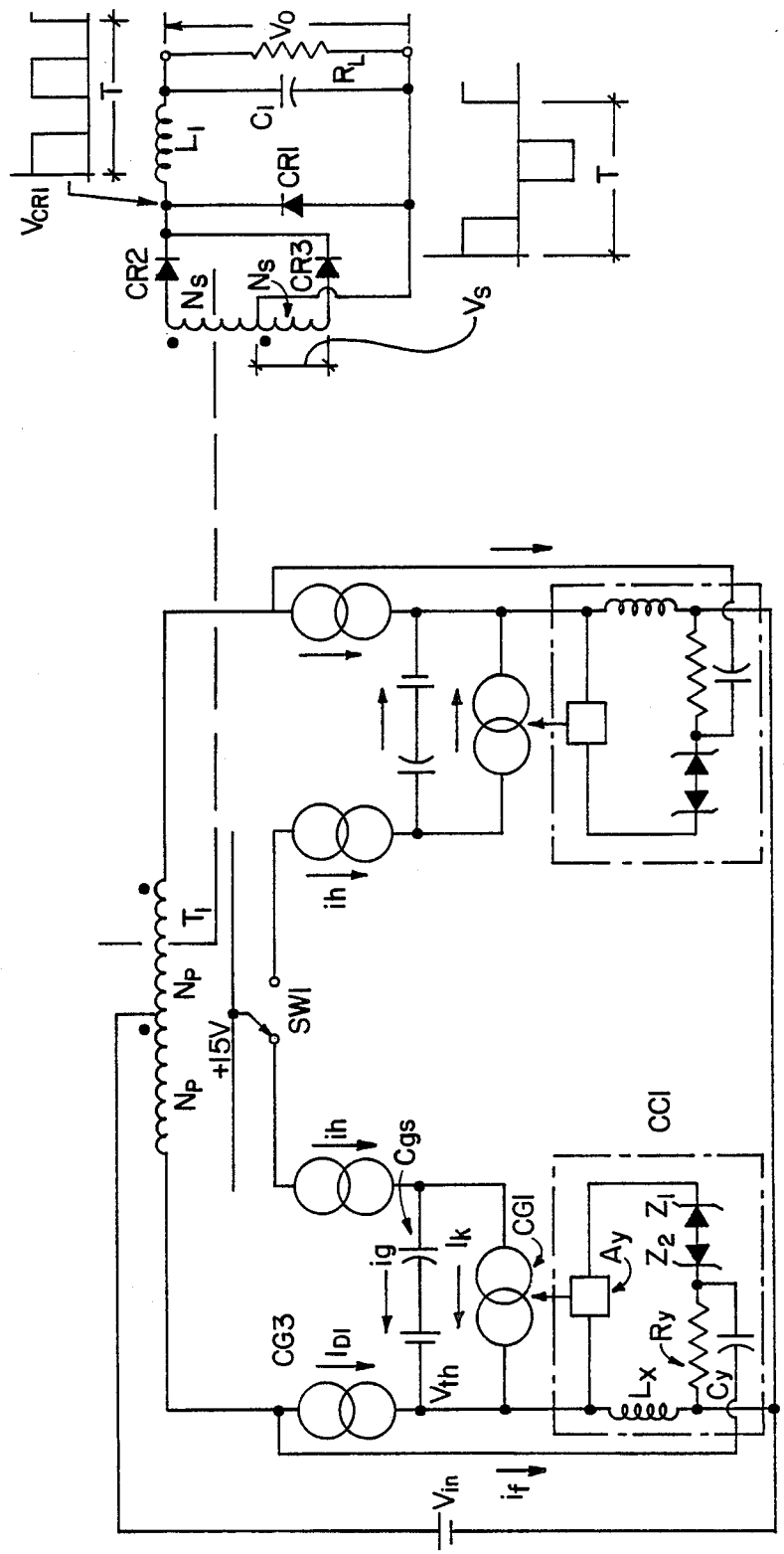
FIG. 18 is an equivalent circuit of the PWM inverter incorporating the improvements according to the invention.

A typical PWM inverter is represented by FIG. 17. Switches $SW_1$ and $SW_2$ alternately turn on transistors $Q_1$ and $Q_2$ producing a modulated a.c. square wave on the $T_1$ windings. This voltage is rectified by diodes $CR_2$ and $CR_3$ to produce a PWM d.c. voltage across $CR_1$. Those skilled in the art will recognize that the invention as described above can be applied directly to this circuit. FIG. 18 shows the circuit of FIG. 12A can be used to make a PWM inverter.

Figure 19:
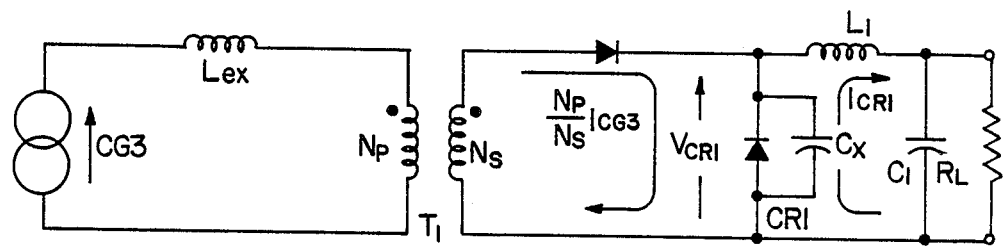
FIG. 19 is an equivalent circuit showing the transformer and leakage reactance of the inverter circuit shown in FIG. 17.

FIG. 19 is an equivalent circuit including transformer $T_1$ and leakage reactance $L_{ex}$. In practice, transformer $T_1$ and diodes $CR_2$ and $CR_3$ are not ideal. Transformer $T_1$ has leakage reactance, winding resistance and interwinding capacitance. Diodes $CR_1$, $CR_2$ and $CR_3$ have finite forward voltage drops and recover times. Additionally, $CR_2$ and $CR_3$ will share the $L_1$ inductor current during $Q_1$ and $Q_2$ off times. Since $L_{ex}$ is in series with $L_x$, its current and rate-of-change of current are the same. Closely controlling the transistor drain current, $I_D$, controls the voltage drop and energy storage of $L_{ex}$ preventing large voltage overshoots. Thus, the undesirable effects of unavoidable transformer leakage inductance have been neutralized and brought under control.

Figure 20:
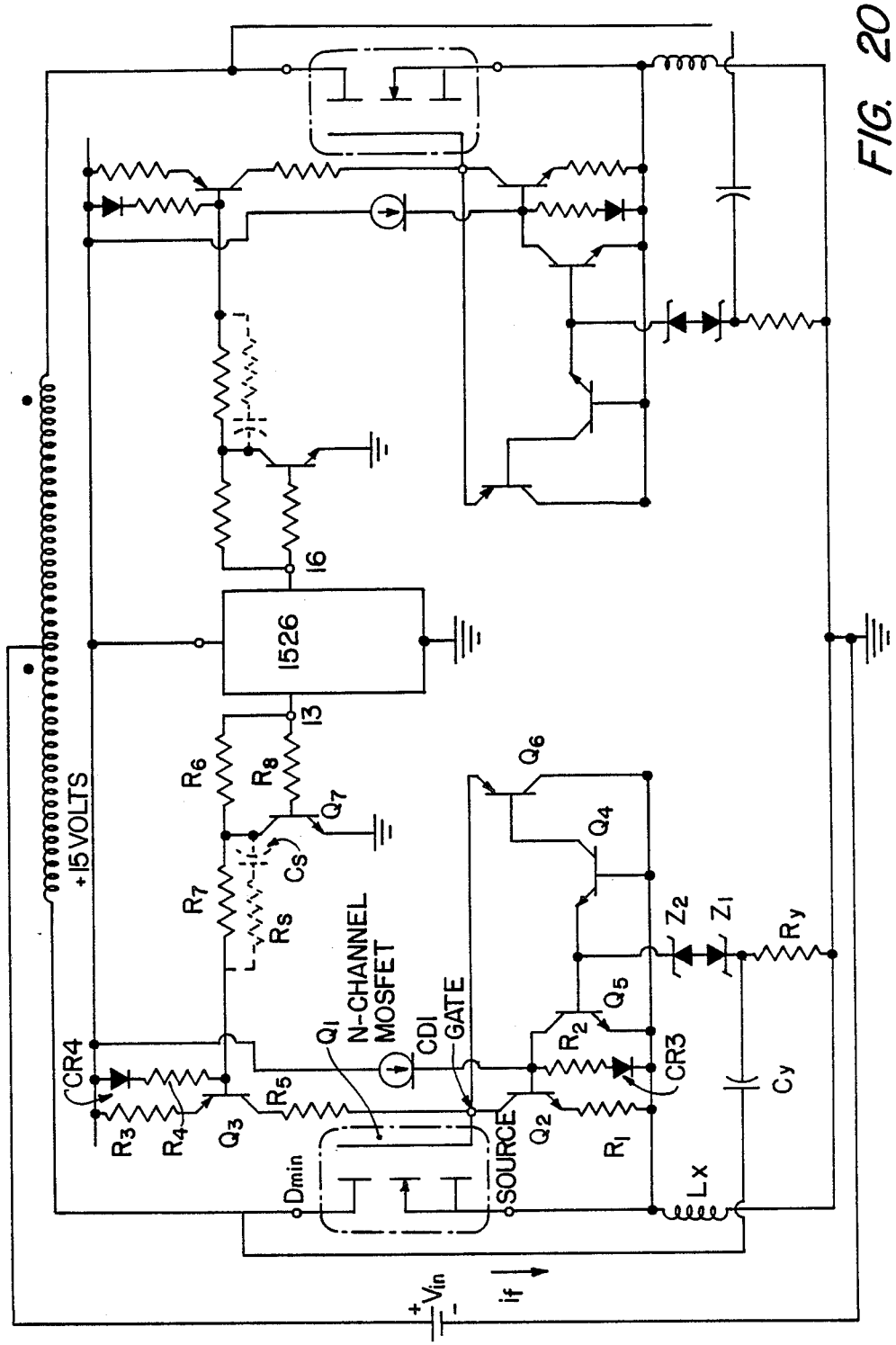
FIG. 20 a schematic diagram showing the precision noise spike elimination circuit applied to PWM inverters according to the invention.

FIG. 20 shows an implementation of the circuit shown in FIG. 18. Here, two "N-versions" of the three current source sets are used, exactly the same as in FIG. 16A, except that PNP transistors replace NPN transistors and an N-channel MOSFET replaces the P-channel MOSFET, and so forth, as will be understood by those skilled in the art.

While the invention has been described in terms of a several preferred embodiments, those skilled in the art will recognize that the invention can be practiced with modification within the spirit and scope of the appended claims.

Having thus described my invention, what I claim as new and desire to secure by Letters Patent is as follows:

1. A dual current source MOSFET turn-on/off circuit including precision noise spike elimination comprising:

a MOSFET connected between a voltage source and a load;

first current source connected to a gate electrode of said MOSFET;

second current source connected in series with said first current source;

control circuit means connected to said first current source for controlling the current supplied by said first current generator and thereby controlling the rate of change of drain current conducted by said MOSFET;

a diode connected across said load and a capacitor connected in parallel with said diode; and negative feedback means connected between said diode and said control circuit means for controlling the current supplied by said first current generator and thereby controlling the rate of change of the voltage across said diode.

2. The dual current source MOSFET turn-on/off circuit including precision noise spike eliminating as recited in claim 1 wherein said control circuit means comprises:

an inductor connected in series between said voltage source and said MOSFET, such that a voltage across said inductor is proportional to the rate of change of said drain current;

back-to-back connected Zener diodes for establishing a voltage reference potential for the voltage across said inductor; and amplifier means responsive to a voltage differential corresponding to a voltage across said inductor exceeding said reference potential for increasing the current supplied by said first current generator.

3. The dual current source MOSFET turn-on/off circuit including precision noise spike elimination as recited in claim 2 wherein said negative feedback means includes differentiation means for generating a feedback current proportional to the rate of change of a voltage across said diode.

4. The dual current source MOSFET turn-on/off circuit including precision noise spike elimination as recited in claim 3 wherein said differentiation means comprises a second capacitor connected to a resistor, a voltage across said resistor being proportional to the rate of change of voltage across said diode, and wherein said amplifier means is further responsive to a voltage differential corresponding to a voltage across said resistor exceeding said reference potential for increasing the current supplied by said first current generator.

5. The dual current source MOSFET turn-on/off circuit including precision noise spike elimination as recited in claim 3 wherein said differentiation means comprises a second capacitor and a pair of parallel connected current reference diodes, and wherein said amplifier means is further responsive to a current differential corresponding to a feedback current through said current reference diodes exceeding a regulating current of said current reference diodes for increasing the current supplied by said first current generator.

6. The dual current source MOSFET turn-on/off circuit including precision noise spike elimination recited in claim 3 wherein said MOSFET is a P-channel MOSFET, said first current source comprises a high gain PNP transistor and said second current source comprises a high gain NPN transistor.

7. The dual current source MOSFET turn-on/off circuit including precision noise spike elimination recited in claim 3 wherein said MOSFET is an N-channel MOSFET, said first current source comprises a high gain NPN transistor and said second current source comprises a high gain PNP transistor.

8. A pulse width modulated inverter comprising first and second dual current source MOSFET turn-on/off circuits including precision noise spike elimination and a transformer connecting said first and second dual current source MOSFET turn-on/off circuits to a load each of said first and second dual current source MOSFET turn-on/off circuits comprising:

a MOSFET connected between a voltage source and said transformer;

first current source connected to a gate electrode of said MOSFET;

second current source connected in series with said first current source;

control circuit means connected to said first current source for controlling the current supplied by said first current generator and thereby controlling the rate of change of drain current conducted by said MOSFET;

a diode connected across said load and a capacitor connected in parallel with said diode; and negative feedback means connected between said transformer and said control circuit means for controlling the current supplied by said first current generator and thereby controlling the rate of change of the voltage across said diode.

9. The pulse width modulated inverter recited in claim 8 wherein said control circuit means comprises:

an inductor connected in series between said voltage source and said MOSFET, such that a voltage across said inductor is proportional to the rate of change of said drain current;

back-to-back connected Zener diodes for establishing a voltage reference potential for the voltage across said inductor; and amplifier means responsive to a voltage differential corresponding to a voltage across said inductor exceeding said reference potential for increasing the current supplied by said first current generator.

10. The pulse width modulated inverter recited in claim 9 wherein said negative feedback means includes differentiation means for generating a feedback current proportional to the rate of change of a voltage across said diode.

11. The pulse width modulator inverter as recited in claim 10 wherein said differentiation means comprises a second capacitor and a pair of parallel connected current reference diodes, and wherein said amplifier means is further responsive to a current differential corresponding to a feedback current through said current reference diodes exceeding a regulating current of said current reference diodes for increasing the current supplied by said first current generator.

12. The pulse width modulated inverter as recited in claim 10 wherein said differentiation means comprises a second capacitor connected to a resistor, a voltage across said resistor being proportional to the rate of change of voltage across said diode, and wherein said amplifier means is further responsive to a voltage differential corresponding to a voltage across said resistor exceeding said reference potential for increasing the current supplied by said first current generator.

13. The pulse width modulator inverter as recited in claim 12 wherein said MOSFET is a P-channel MOSFET, said first current source comprises a high gain PNP transistor and said second current source comprises a high gain NPN transistor.

14. The pulse width modulated inverter as recited in claim 12 wherein said MOSFET is an N-channel MOSFET, said first current source comprises a high gain NPN transistor and said second current source comprises a high gain PNP transistor.

* * * * *